(12) United States Patent
Leon

(10) Patent No.: US 6,798,263 B1
(45) Date of Patent: Sep. 28, 2004

(54) RESET FEATURE FOR A LOW VOLTAGE DIFFERENTIAL LATCH

(75) Inventor: Christopher R. Leon, Irvine, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/304,310

(22) Filed: Nov. 25, 2002

(51) Int. Cl.[7] .................... H03K 3/289; H03K 3/356
(52) U.S. Cl. ................. 327/203; 327/217; 327/218
(58) Field of Search ........................ 327/202, 203, 327/208, 217, 218, 57, 89; 326/115, 126

(56) References Cited

U.S. PATENT DOCUMENTS

| | | | |
|---|---|---|---|
| 5,172,011 A | | 12/1992 | Leuthold et al. ............ 327/202 |
| 5,349,554 A | * | 9/1994 | Delker ................. 365/189.05 |
| 5,488,319 A | * | 1/1996 | Lo ............................. 326/115 |
| 5,508,648 A | | 4/1996 | Banik ......................... 327/203 |
| 5,576,644 A | * | 11/1996 | Pelella ......................... 327/51 |
| 5,850,155 A | * | 12/1998 | Matsumoto ................. 326/109 |
| 5,900,760 A | | 5/1999 | Lee ............................. 327/202 |

OTHER PUBLICATIONS

U.S. 2003/0160644A1, "High Speed Fully Balanced Differential Flip Flop With Reset" by Ling, Aug. 28, 2003.*

* cited by examiner

Primary Examiner—Tuan T. Lam
(74) Attorney, Agent, or Firm—INCAPLAW; Terrance A. Meador

(57) ABSTRACT

A differential latch circuit with a differential reset function includes a first arrangement of transistors configured to perform a latch function and a second arrangement of transistors, connected to the first arrangement of transistors, configured to perform a reset function. The first arrangement of transistors includes branches having three cascoded transistors, and the second arrangement of transistors includes branches having two cascoded transistors. This configuration enables the latch circuit to use lower power supply voltages relative to conventional latch circuits that require four more cascoded transistors.

16 Claims, 3 Drawing Sheets

FIG. 1 – PRIOR ART

RESET FEATURE FOR A LOW VOLTAGE DIFFERENTIAL LATCH

FIELD OF THE INVENTION

The present invention relates generally to differential digital latch circuits. More particularly, the present invention relates to a reset function for a differential latch operating at a low voltage.

BACKGROUND OF THE INVENTION

High speed digital data communication systems may utilize fully differential latches to process data Differential latches are commonly used because they reduce the effects of coupling noise. FIG. 1 is a schematic representation of a prior art differential latch circuit 100 having a differential reset feature. The input data signal 102, the clock signal 104, the reset signal 106, and the output data signal 108 are differential, which forces the structure of circuit 100 to have four active devices (e.g., transistors) connected in series. In this regard, a first transistor level accommodates input data signal 102, a second transistor level accommodates clock signal 104, a third transistor level accommodates reset signal 106, and a fourth transistor level functions as a bias current source for latch circuit 100.

The reset operation of latch circuit 100 is performed when reset signal 106 corresponds to a logic high value. When reset signal 106 is high, transistor M8 is switched on and transistor M7 is switched off. Under these conditions, transistor M8 steers the bias current (generated by transistor M9) away from transistors M1–M6, thus switching transistors M1–M6 off. In this state, the positive component of output data signal 108 becomes VDD minus the voltage drop across resistance R, and the negative component of output data signal 108 becomes VDD, resulting in a logic low value for output data signal 108.

The normal operation of latch circuit 100 is performed when reset signal 106 corresponds to a logic low value. When reset signal 106 is low, transistor M8 is switched off and transistor M7 is switched on. Under these conditions, transistor M7 steers the bias current to transistors M1–M6, which perform a conventional latching function. Transistors M1 and M2 buffer input data signal 102 when clock signal 104 is high, and transistors M3 and M4 store the data buffered by transistors M1 and M2 when clock signal 104 is low.

As shown in FIG. 1, transistors in the four transistor levels are connected in series (the source of the transistor in a previous level is connected to the drain of the transistor in the next level). The number of series-connected transistors dictates the minimum power supply voltage (VDD) required for proper operation of circuit 100. In practical applications, the power supply voltage is fixed, thus limiting the number of series-connected transistors that can be deployed in circuit 100.

BRIEF SUMMARY OF THE INVENTION

A differential latch circuit according to an example embodiment includes a differential reset function implemented with no more than three levels of series-connected transistors. With this configuration, the latch circuit can be deployed in applications having low voltage power supplies, relative to conventional latch circuits that require additional levels of transistors.

The above and other aspects of the present invention may be carried out in one form by a differential latch circuit comprising a first arrangement of transistors configured to perform a latch function, in response to a differential latch input and a differential clock signal, that provides a differential latch output, and a second arrangement of transistors connected to the first arrangement of transistors, the second arrangement of transistors being configured to perform a reset function, in response to a differential reset voltage, that drives the differential latch output to a logic low state. In this embodiment, the first arrangement of transistors includes a maximum of three levels of series-connected transistors, and the second arrangement of transistors includes a maximum of three levels of series-connected transistors.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. In addition, those skilled in the art will appreciate that the present invention may be practiced in conjunction with any number of data communication applications and that the system described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional aspects of the circuits (and the individual operating components of the circuits) may not be described in detail herein. Furthermore, the connecting lines shown in the various figures contained herein are intended to represent exemplary functional relationships and/or physical couplings between the various elements. It should be noted that alternative or additional functional relationships or physical connections may be present in a practical embodiment.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits are not adversely affected).

As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 1:
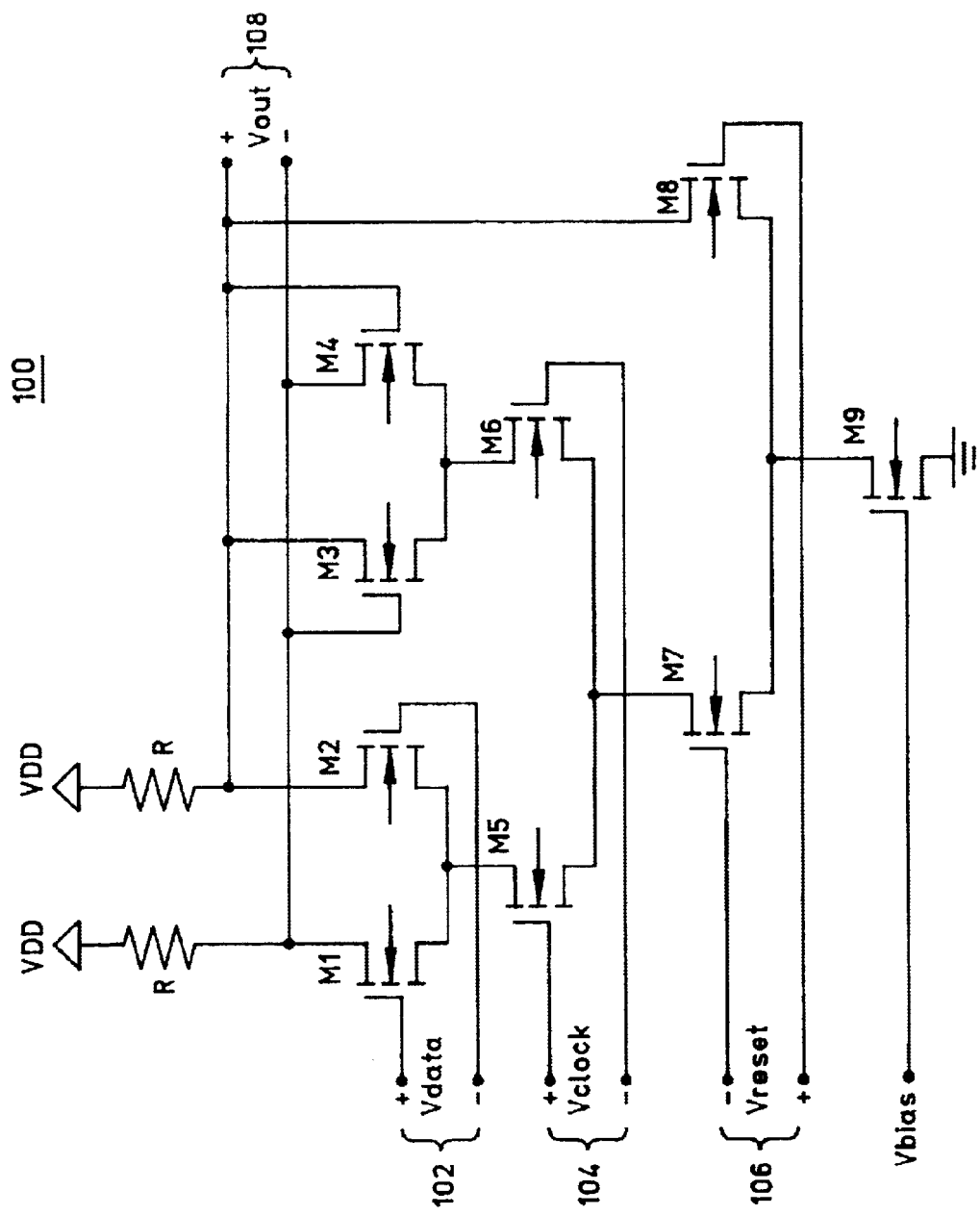
FIG. 1 is a schematic representation of a prior art differential latch circuit having a differential reset function.
Figure 2:
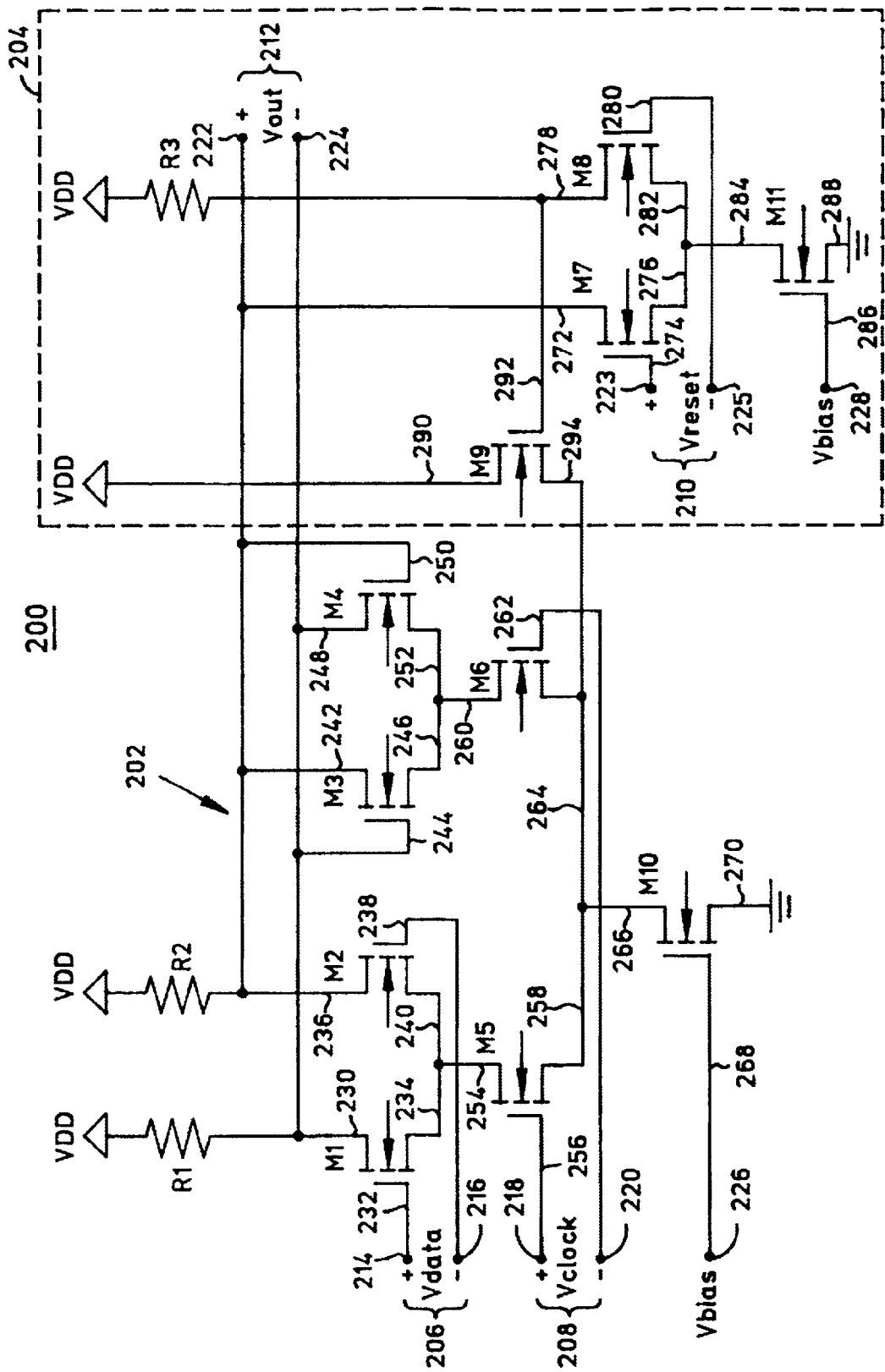
FIG. 2 is a schematic representation of a differential latch circuit having a differential reset function.

FIG. 2 is a schematic representation of a differential latch circuit 200 configured in accordance with a preferred embodiment of the invention. Latch circuit 200 may be generally separated into a latch section/architecture 202 that performs a latch function and a reset section/architecture 204 that performs a reset function. In the example embodiment, latch section 202 includes a first arrangement of transistors and reset section 204 includes a second arrangement of transistors that is connected to the first arrangement of transistors. In this regard, latch section 202 includes at least seven transistors (respectively identified by the designators M1, M2, M3, M4, M5, M6, and M10) and reset section 204 includes at least four transistors (respectively identified by the designators M7, M8, M9, and M11). A practical embodiment of latch circuit 200 employs MOSFET transistors for transistors M1–M11. Equivalent latch circuits may be configured for operation with other transistor types and/or with other suitable active devices or switches.

Latch circuit 200 receives a differential latch input signal 206, a differential clock signal 208, and a differential reset signal 210. The frequencies of these signals may vary from very low frequencies (e.g., in the Hz range) to very high frequencies (e.g., in the GHz range), depending upon the particular device types, process technology, and application for circuit 200. When operating in the normal latch mode, circuit 200 provides a differential latch output signal 212 in response to input signal 206 and clock signal 208. When operating in the reset mode, the latch functionality is overridden and circuit 200 generates a logic low state at latch output signal 212. Activation of the reset mode is responsive to the state of differential reset signal 210.

Latch circuit 200 includes a positive input voltage node 214 for the positive component of differential input signal 206, and a negative input voltage node 216 for the negative component of differential input signal 206. Circuit 200 also includes a positive clock signal node 218 for the positive component of differential clock signal 208, and a negative clock signal node 220 for the negative component of differential clock signal 208. Circuit 200 also includes a positive output voltage (Voutp) node 222 for the positive component of differential latch output signal 212, and a negative output voltage (Voutn) node 224 for the negative component of differential latch output signal 212. Circuit 200 also includes a positive reset signal node 223 for the positive component of differential reset signal 210, and a negative reset signal node 225 for the negative component of differential reset signal 210. Latch circuit 200 may also include a first bias voltage node 226 for a first bias voltage, and a second bias voltage node 228 for a second bias voltage. The bias voltage for CMOS process is higher than the threshold voltage (Vth) of the transistor, but lower than the power supply voltage (Vdd). In practice, the bias voltage is set such that the transistors M10 and M11 operate in the saturation region under all of the different operating conditions of circuit 200 (process, temperature, power supply, and input signal variations). Latch circuit 200 is configured to operate in conjunction with one or more reference voltages. For example, latch circuit 200 may operate with a reference supply voltage (VDD) and a second reference voltage that is less than VDD. In accordance with one practical embodiment, VDD is held within a specified range (e.g., between 1.08 and 1.32 volts), and the second reference voltage is ground. As shown in FIG. 2, one or more components may be connected to VDD, and one or more components may be connected to ground.

Transistors M1 and M2 form a differential pair that receives differential input signal 206. Transistor M1 has a drain node 230 connected to Voutn node 224 and to VDD through a first resistance R1. The value of R1, which can vary from one practical application to another, is selected according to the desired peak-to-peak output voltage swing and according to the current generated by transistors M10 and M11. In the practical embodiment, drain node 230 is directly connected to, and therefore corresponds to, Voutn node 224. Transistor M1 also has a gate node 232 connected to positive input voltage node 214, and a source node 234. In the practical embodiment, gate node 232 is directly connected to, and therefore corresponds to, positive input voltage node 214. Transistor M2 has a drain node 236 connected to Voutp node 222 and to VDD through a second resistance R2. The value of R2, which can vary from one practical application to another, is also selected according to the desired peak-to-peak output voltage swing and according to the current generated by transistors M10 and M11. In the preferred embodiment, resistance R1 equals resistance R2 to ensure symmetrical operation of the differential pair. In the practical embodiment, drain node 236 is directly connected to, and therefore corresponds to, Voutp node 222. Transistor M2 also has a gate node 238 connected to negative input voltage node 216, and a source node 240 connected to source node 234 of transistor M1. In the practical embodiment, gate node 238 is directly connected to, and therefore corresponds to, negative input voltage node 216, and source node 240 is directly connected to, and therefore corresponds to, source node 234.

Transistors M3 and M4 form another differential pair that cooperates with transistors M1 and M2 to store the buffered input data associated with differential input signal 206. Transistor M3 has a drain node 242 connected to Voutp node 222 and to VDD through second resistance R2. In the practical embodiment, drain node 242 is directly connected to, and therefore corresponds to, both Voutp node 222 and drain node 236 of transistor M2. Transistor M3 also has a gate node 244 connected to Voutn node 224, and a source node 246. In the practical embodiment, gate node 244 is directly connected to, and therefore corresponds to, both Voutn node 224 and drain node 230 of transistor M1. Transistor M4 has a drain node 248 connected to Voutn node 224 and to VDD through first resistance R1. In the practical embodiment, drain node 248 is directly connected to, and therefore corresponds to: Voutn node 224, gate node 244 of transistor M3, and drain node 230 of transistor M1. Transistor M4 also has a gate node 250 connected to Voutp node 222, and a source node 252 connected to source node 246 of transistor M3. In the practical embodiment, gate node 250 is directly connected to, and therefore corresponds to: Voutp node 222, drain node 242 of transistor M3, and drain node 236 of transistor M2. In the practical embodiment, source node 252 is directly connected to, and therefore corresponds to, source node 246.

Transistors M1–M4 are referred to herein as "first-level" transistors in the arrangement of transistors that form latch section 202. In this regard, "first-level" means that each of transistors M1–M4 are the first transistors in series between VDD and ground, where the series-connected transistors are connected from source-to-drain. These first-level transistors are suitably configured to process differential input signal 206 and differential output signal 212 in a conventional manner.

Transistors M5 and M6 form another differential pair that receives differential clock signal 208. Transistor M5 has a drain node 254 connected to source node 234 of transistor M1 and to source node 240 of transistor M2. In the practical embodiment, drain node 254 is directly connected to, and therefore corresponds to, both source node 234 and source node 240. Transistor M5 also has a gate node 256 connected to positive clock signal node 218, and a source node 258. In the practical embodiment, gate node 256 is directly connected to, and therefore corresponds to, positive clock signal node 218. Transistor M6 has a drain node 260 connected to source node 246 of transistor M3 and to source node 252 of transistor M4. In the practical embodiment, drain node 260 is directly connected to, and therefore corresponds to, both source node 246 and source node 252. Transistor M6 also has a gate node 262 connected to negative clock signal node 220, and a source node 264. In the practical embodiment, gate node 262 is directly connected to, and therefore corresponds to, negative clock signal node 220. In the practical embodiment, source node 264 is directly connected to, and therefore corresponds to, source node 258.

Transistors M5 and M6 are referred to herein as "second-level" transistors in the arrangement of transistors that form latch section 202. In this regard, "second-level" means that each of transistors M5 and M6 is the second transistor in series between VDD and ground, where the series-connected transistors are connected from source-to-drain. In other words, the drain of each second-level transistor is connected to a source of a first-level transistor. These second-level transistors are suitably configured to process differential clock signal 208.

Transistor M10 has a drain node 266 connected to source node 258 of transistor M5 and to source node 264 of transistor M6. In the practical embodiment, drain node 266 is directly connected to, and therefore corresponds to, both source node 258 and source node 264. Transistor M10 also has a gate node 268 connected to first bias voltage node 226, and a source node 270 connected to ground. In the practical embodiment, gate node 268 is directly connected to, and therefore corresponds to, first bias voltage node 226. Transistor M10 is configured to function as a bias current source, where the bias current is determined by the bias voltage present at first bias voltage node 226 and the physical and electrical characteristics of transistor M10. In this regard, drain node 266 may be considered to be a positive bias current source node. The actual bias current can vary depending upon the desired speed of latch circuit 200. In practice, the bias current may be as low as 10 microamperes and as high as 100 milliamperes, depending upon the desired speed of operation.

Transistor M10 is referred to herein as a "third-level" transistor in the arrangement of transistors that form latch section 202. In this regard, "third-level" means that transistor M10 is the third transistor in series between VDD and ground, where the series-connected transistors are connected from source-to-drain. In other words, drain node 266 of transistor M10 is connected to a source of a second-level transistor. In the preferred embodiment, the arrangement of transistors that form latch section 202 includes a maximum of three levels of series-connected transistors. For example, transistors M1, M5, and M10 form one branch of three series-connected transistors, and transistors M4, M6, and M10 form another branch of three series-connected transistors.

Regarding reset section 204, transistors M7 and M8 form another differential pair that processes differential reset signal 210. Transistor M7 has a drain node 272 connected to Voutp node 222 and to VDD through second resistance R2. In the practical embodiment, drain node 272 is directly connected to, and therefore corresponds to: Voutp node 222, drain node 236 of transistor M2, drain node 242 of transistor M3, and gate node 250 of transistor M4. Transistor M7 also has a gate node 274 connected to positive reset signal node 223, and a source node 276. In the practical embodiment, gate node 274 is directly connected to, and therefore corresponds to, positive reset signal node 223. Transistor M8 has a drain node 278 connected to VDD through a third resistance R3. The value of R3, which can vary from one practical application to another, is selected such that transistor M9 remains off when circuit 200 is operating in the normal, non-reset mode (as described in more detail below). In the practical embodiment, third resistance R3 is greater than first resistance R1 (and greater than second resistance R2, assuming resistance R1 equals resistance R2). Transistor M8 also has a gate node 280 connected to negative reset signal node 225, and a source node 282 connected to source node 276 of transistor M7. In the practical embodiment, gate node 280 is directly connected to, and therefore corresponds to, negative reset signal node 225. In the practical embodiment, source node 282 is directly connected to, and therefore corresponds to, source node 276.

Transistors M7 and M8 are referred to herein as "first-level" transistors in the arrangement of transistors that form reset section 204. These first-level transistors are suitably configured to process differential reset signal 210.

Transistor M11 has a drain node 284 connected to source node 276 of transistor M7 and to source node 282 of transistor M5. In the practical embodiment, drain node 284 is directly connected to, and therefore corresponds to, both source node 276 and source node 282. Transistor M11 also has a gate node 286 connected to second bias voltage node 228, and a source node 288 connected to ground. In the practical embodiment, gate node 286 is directly connected to, and therefore corresponds to, second bias voltage node 228. Transistor M11 is configured to function as a bias current source, where the bias current is determined by the bias voltage present at second bias voltage node 228 and the physical and electrical characteristics of transistor M11. In the preferred embodiment, the bias current generated by transistor M11 equals the bias current generated by transistor M10.

Transistor M11 is referred to herein as a "second-level" transistor in the arrangement of transistors that form reset section 202. In this regard, "second-level" means that transistor M11 is the second transistor in series between VDD and ground, where the series-connected transistors are connected from source-to-drain. In other words, drain node 284 of transistor M11 is connected to a source of a first-level transistor. In the preferred embodiment, the arrangement of transistors that form reset section 204 includes a maximum of three levels of series-connected transistors. For example, transistors M7 and M11 form a branch of two series-connected transistors, and transistors M8 and M11 form another branch of two series-connected transistors.

Transistor M9 has a drain node 290 connected to VDD (in the example embodiment, drain node 290 is directly connected to VDD), and a gate node 292 connected to VDD through third resistance R3. In the practical embodiment, gate node 292 is directly connected to, and therefore corresponds to drain node 278 of transistor M8. Transistor M9 also has a source node 294 connected to drain node 266 of transistor M10. In the practical embodiment, source node 294 is directly connected to, and therefore corresponds to: drain node 266 of transistor M10, source node 258 of transistor M5, and source node 264 of transistor M6.

The objective of the reset function of latch circuit 200 is to drive differential output signal 212 to a logic low state, regardless of the logic state of differential input signal 206. The reset mode is activated when differential reset signal 210 is at a logic high state. In contrast, when differential reset signal 210 is at a logic low state, latch circuit 200 operates in a normal latch mode, i.e., differential output signal 212 is responsive to differential input signal 206 and differential clock signal 208.

When differential reset signal 210 represents a logic low state (i.e., the voltage at positive reset signal node 223 is low and the voltage at negative reset signal node 225 is high), transistor M7 is off and transistor M8 is on. In other words, transistor M8 is driven into the saturation state. Consequently, the bias current generated by transistor M11 is steered to transistor M8, voltage is dropped across resistance R3, and the voltage at gate node 292 of transistor M9 equals VDD-$V_{R3}$, where $V_{R3}$ is the voltage drop across resistance R3. Under these conditions, transistor M9 remains off, and the bias current generated by transistor M10 is steered to latch section 202. Latch section 202 buffers and stores the incoming data in response to differential clock signal 208 and in accordance with known techniques. The operation of latch section 202 is unimportant for purposes of the invention and, therefore, will not be described in detail herein. The differential output signal 212 is unaffected by reset section 204 because transistor M7 effectively functions as an open circuit.

When differential reset signal 210 represents a logic high state (i.e., the voltage at positive reset signal node 223 is high and the voltage at negative reset signal node 225 is low), transistor M7 is on and transistor M8 is off. In other words, transistor M7 is driven into the saturation state. Under these conditions, transistor M8 effectively functions as an open circuit, no current flows through third resistance R3, and, consequently, the voltage at gate node 292 of transistor M9 equals VDD. Transistor M9 is driven into the saturation state when its gate voltage equals VDD, and the bias current generated by transistor M10 is steered to transistor M9 and away from transistors M1–M6. As described in more detail below, the characteristics of the transistors and resistances can be suitably selected to ensure that transistor M9 steers substantially all of the bias current away from transistors M1–M6. In other words, under these conditions transistor M9 effectively disables transistors M1–M6.

The disablement of transistors M1–M6 causes transistors M1–M4 to function as open circuits. Consequently, latch section 202 has no effect on the state of differential output signal 212, and the voltage at Voutn node 224 equals VDD. In contrast, transistor M7 (which is active under the assumed conditions) enables current flow through second resistance R2, resulting in a voltage drop across second resistance R2. Thus, the voltage at Voutp node 222 equals VDD-$V_{R2}$, where $V_{R2}$ is the voltage drop across resistance R2. In other words, the voltage at Voutp node 222 is relatively low and the voltage at Voutn node 224 is relatively high, which corresponds to a logic low state for differential output signal 212.

To ensure proper operation of the reset function in latch circuit 200, transistors M5 and M6 should be deactivated or otherwise operated such that most of the bias current from transistor M10 is steered to transistor M9. Notably, transistors M5, M6, and M9 all share a common source node. Accordingly, the transistors are appropriately sized to ensure that the gate-to-source voltage of transistor M9 is much less than the gate-to-source voltage of transistor M5 (or transistor M6). Expressions for the relative characteristics of a number of components of latch circuit 200 will be derived below with reference to FIG. 3 and FIG. 4. The resulting expressions indicate that the reset function of latch circuit 200 can indeed be implemented with practical components.

Figure 3:
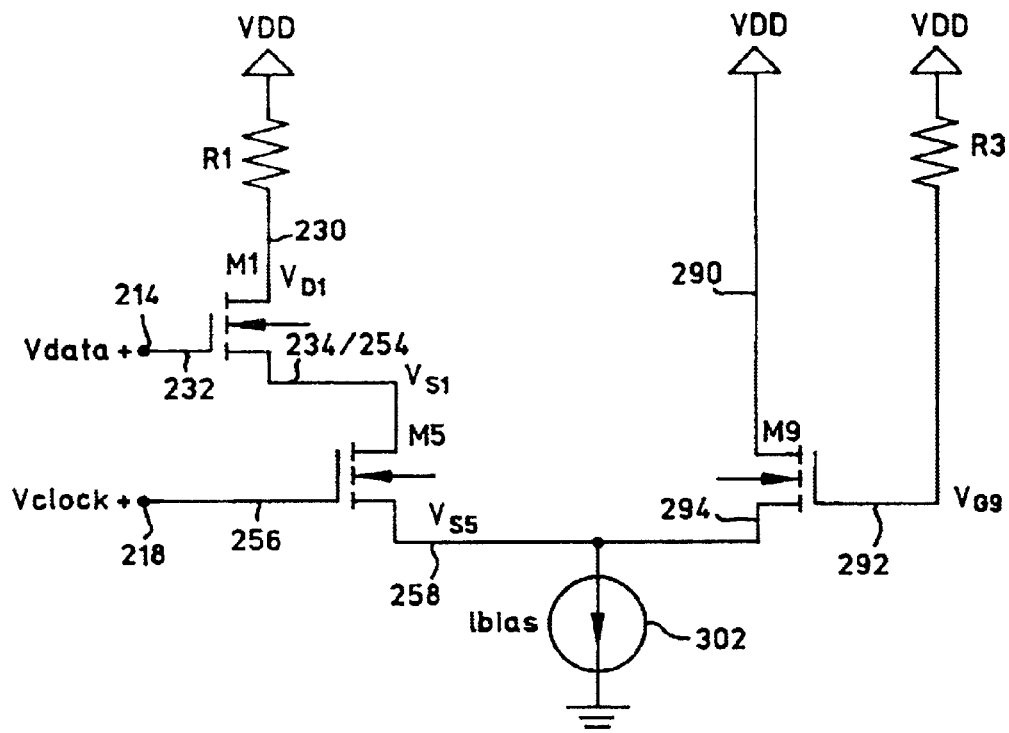
FIG. 3 is a schematic representation of a simplified portion of the differential latch circuit of FIG. 2, corresponding to the state when the differential reset signal is a logic high.

FIG. 3 is a schematic representation of a simplified portion of differential latch circuit 200, corresponding to the state when the differential reset signal 210 is a logic high. FIG. 3 is derived from latch circuit 200, assuming that: differential input signal 206 is logic high, differential clock signal 208 is logic high, and differential reset signal 210 is logic high. Under these conditions, transistors M2, M3, M4, M6, and M8 are inactive and, therefore, are not depicted in FIG. 3. In FIG. 3, transistor M10 is represented by a bias current source 302, and active transistor M7 is not shown because it has no effect on the operation of transistor M9.

For purposes of this derivation, the voltage at positive input signal node 214 is assumed to be the highest possible voltage, i.e., VDD. Likewise, the voltage at positive clock signal node 218 is assumed to be VDD. Furthermore, the threshold voltage (Vth) of transistor M1 is assumed to be equal to the Vth of transistor M5. The inactive state of transistor M8 forces the voltage at gate node 292 of transistor M9 to VDD. For proper operation of the reset function, any current flowing through transistor M5 should be very low compared to the bias current. Accordingly, for purposes of this analysis, the voltage at drain node 230 of transistor M1 is equal to VDD. In other words, the drain voltage of transistor M1 and the gate voltage of transistor M1 are both equal to VDD, and transistor M1 operates in the saturation region because the voltage between its drain and gate is greater than–Vth. The source voltage of transistor M1 is given by the following equation (1):

$$V_{S1}=VDD-Vth-\delta_1 \qquad (1)$$

where $\delta_1$, is a very small voltage drop caused by the slight current flowing through transistor M1. When $\delta_1>0$ and the gate voltage of transistor M5 is VDD, transistor M5 operates in the triode region because the voltage between its drain and gate is equal to ($V_{S1}$-VDD). Substituting equation (1) into this expression yields the following expression for the drain-to-gate voltage of transistor M5:–Vth-$\delta^1$.

The source voltage of transistor M5 is given by the following equation (2):

$$V_{S5}=VDD-Vth-\delta_5 \qquad (2)$$

With $\delta_5>0$, and subtracting equation (2) from equation (1), the voltage between the drain and source of transistor M5 is given by the following equation (3):

$$V_{DSS}=V_{S1}-V_{S5}=\delta_5-\delta_1 \qquad (3)$$

The voltage between the gate and source of transistor M5 is presented in equation (4):

$$V_{GSS}=VDD-V_{SS}=Vth+\delta_5 \qquad (4)$$

The well known textbook equation for transistor current in the triode region is provided as equation (5):

$$I = \frac{KW}{L}\left[(V_{GS} - Vth) \times V_{DS} - \frac{V_{DS}^2}{2}\right] \quad (5)$$

In equation (5), K is a process-dependent device parameter for the transistor in question, W is the width of the transistor, and L is the channel length of the transistor. Replacing equation (3) and equation (4) into equation (5), and after manipulation, the result for the current through transistor M5 is given by equation (6):

$$I_{M5} = \frac{KW_5}{2L_5}(\delta_5^2 - \delta_1^2) \quad (6)$$

The voltage between the drain and gate of transistor M9 is equal to zero, which forces it to operate in the saturation region. The equation for current through transistor M9 is given by equation (7):

$$I_{M9} = \frac{KW_9}{2L_9}(V_{GS9} - Vth)^2 \quad (7)$$

The voltage between the gate and source of transistor M9 is given by equation (8):

$$V_{GS9} = VDD - V_{SS} \quad (8)$$

Substituting equation (2) into equation (8) yields the following equation (9):

$$V_{GS9} = VDD - (VDD - Vth - \delta_s) = \delta_s + Vth \quad (9)$$

Finally, substituting equation (9) into equation (7) yields equation (10):

$$I_{M9} = \frac{KW_9}{2L_9}\delta_5^2 \quad (10)$$

Equation (6) and equation (10) show that the bias current can be forced to flow through transistor M9 rather than transistor M5 by, for example, selecting proper W/L ratios for the transistors. In addition, the current for transistor M9 is dictated by the multiplier $\delta_5^2$, while the current for transistor M5 is dictated by the multiplier $(\delta_5^2 - \delta_1^2)$, which approaches zero as $\delta_5$ approaches $\delta_1$.

Figure 4:
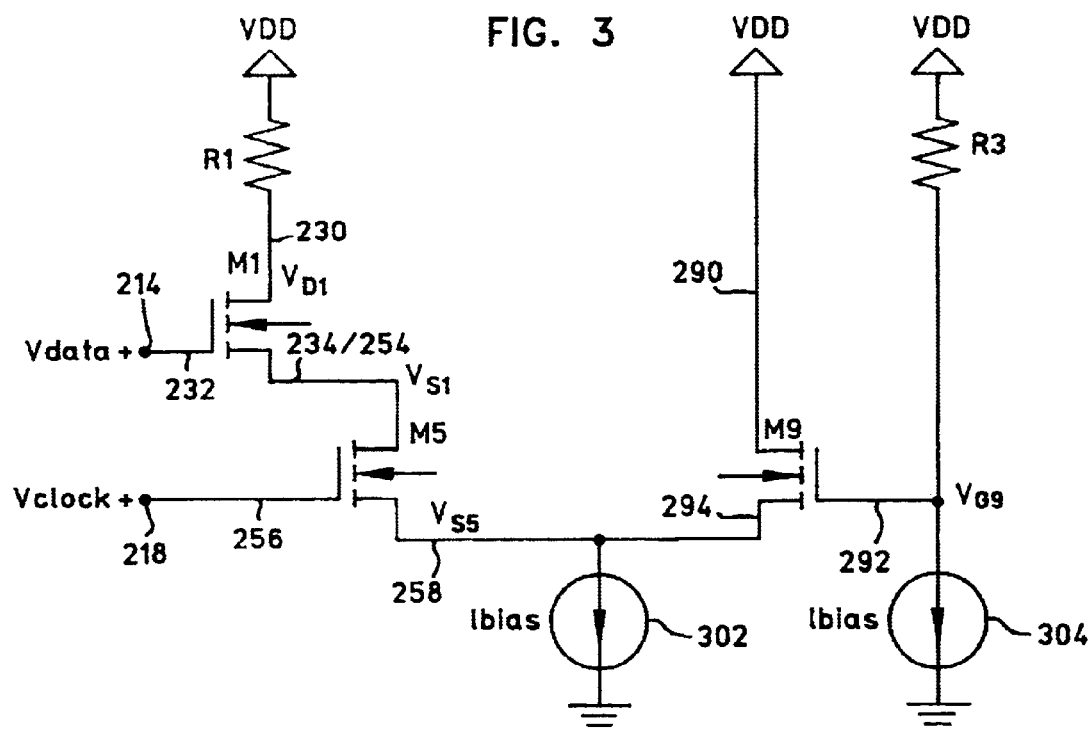
FIG. 4 is a schematic representation of a simplified portion of the differential latch circuit of FIG. 2, corresponding to the state when the differential reset signal is a logic low.

FIG. 4 is a schematic representation of a simplified portion of differential latch circuit 200, corresponding to the state when the differential reset signal is a logic low. FIG. 4 is derived from latch circuit 200, assuming that: differential input signal 206 is logic high, differential clock signal 208 is logic high, and differential reset signal 210 is logic low. Under these conditions, transistors M2, M3, M4, M6, and M7 are inactive and, therefore, are not depicted in FIG. 4. In FIG. 4, transistor M10 is represented by a bias current source 302, and transistors M8 and M11 are collectively represented by a bias current source 304.

For purposes of this derivation, the voltage at positive input signal node 214 is assumed to be the highest possible voltage, i.e., VDD. Likewise, the voltage at positive clock signal node 218 is assumed to be VDD. Furthermore, the threshold voltage (Vth) of transistor M1 is assumed to be equal to the Vth of transistor M5. The logic low state of reset signal 210 activates transistor M8, which forces the voltage at gate node 292 of transistor M9 to a voltage less than VDD (due to the voltage drop across resistance R3). For proper operation of latch circuit 200, this condition should turn transistor M9 off, thus steering the current from bias current source 302 toward the latch transistors.

Assuming that transistor M9 is inactive, the drain voltage of transistor M1 is given by equation (11):

$$V_{D1} = VDD - (I_{BIAS} \times R1) \quad (11)$$

The quantity $(I_{BIAS} \times R1)$ is designed to be larger than Vth, and (since the voltage at positive input signal node 214 is equal to VDD) transistor M1 is forced into the triode region. Under these conditions, the source voltage of transistor M1 is given by equation (12):

$$V_{S1} = VDD - (I_{BIAS} \times R1) - V_{DS1} \quad (12)$$

The drain voltage of transistor M5, which corresponds to the source voltage of transistor M1, is also given by equation (12). Under these conditions, transistor M5 also operates in the triode region because the voltage between the drain and gate of transistor M5 ($V_{DG5}$) is lower than −Vth. Accordingly, the voltage at the source of transistor M5 can be given by equation (13):

$$V_{SS} = VDD - (I_{BIAS} \times R1) - V_{DS1} - V_{DS5} \quad (13)$$

For transistor M9 to be in the inactive state, the voltage between the gate and source of transistor M9 must be less than Vth, as shown in equation (14):

$$VDD - (I_{BIAS} \times R3) - V_{SS} < Vth \quad (14)$$

Substituting equation (13) into equation (14), and after some manipulation, the following expression can be derived:

$$R3 > R1 + \frac{V_{DS1} + V_{DS5} - Vth}{I_{BIAS}} \quad (15)$$

Expression (15) indicates that resistance R3 can be selected to be large enough to ensure that transistor M9 remains in the inactive or off state. In this regard, resistance R3 will be greater than resistance R1.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A differential latch circuit comprising:
   a positive output voltage (Voutp) node for a positive component of a differential latch output, said Voutp node being connected to a reference voltage through a first resistance;
   a negative output voltage (Voutn) node for a negative component of said differential latch output, said Voutn node being connected to said reference voltage through a second resistance;
   a first bias current source configured to generate a first bias current;
   a first transistor having a first drain node connected to said reference voltage, a first gate node connected to said reference voltage through a third resistance, and a first source node connected to said first bias current source;
   a second transistor having a second drain node connected to said Voutp node, a second gate node for a positive component of a differential reset signal, and a second source node;

a third transistor having a third drain node connected to said first gate node, a third gate node for a negative component of said differential reset signal, and a third source node connected to said second source node; and a second bias current source connected to said second source node and to said third source node, said second bias current source being configured to generate a second bias current.

2. A differential latch circuit according to claim 1, wherein said first resistance equals said second resistance.

3. A differential latch circuit according to claim 2, wherein said third resistance is greater than said first resistance.

4. A differential latch circuit according to claim 1, wherein said first bias current equals said second bias current.

5. A differential latch circuit according to claim 1, wherein a logic high state of said differential reset signal drives said first transistor into a saturation state.

6. A differential latch circuit according to claim 5, wherein said logic high state of said differential reset signal drives said differential latch output to a logic low state.

7. A differential latch circuit according to claim 1, further comprising an arrangement of transistors configured to perform a latch function, said arrangement of transistors being connected to said Voutp node, to said Voutn node, and to said first bias current source.

8. A differential latch circuit according to claim 7, wherein said arrangement of transistors comprises:

a fourth transistor having a fourth drain node connected to said Voutn node, a fourth gate node for a positive component of a differential latch input, and a fourth source node;

a fifth transistor having a fifth drain node connected to said Voutp node, a fifth gate node for a negative component of said differential latch input, and a fifth source node connected to said fourth source node;

a sixth transistor having a sixth drain node connected to said Voutp node, a sixth gate node connected to said Voutn node, and a sixth source node;

a seventh transistor having a seventh drain node connected to said Voutn node, a seventh gate node connected to said Voutp node, and a seventh source node connected to said sixth source node;

an eighth transistor having an eighth drain node connected to said fourth source node and to said fifth source node, an eighth gate node for a positive component of a differential dock signal, and an eighth source node connected to said first source node; and a ninth transistor having a ninth drain node connected to said sixth source node and to said seventh source node, a ninth gate node for a negative component of said differential clock signal, and a ninth source node connected to said first source node and to said eighth source node.

9. A differential reset architecture for a differential latch circuit having an arrangement of transistors configured to perform a latch function in response to a differential latch input and a differential clock signal, a positive output voltage (Voutp) node for a positive component of a differential latch output, a negative output voltage (Voutn) node for a negative component of said differential latch output, and a bias current source node, said differential reset architecture comprising:

a first transistor having a first drain node connected to a reference voltage, a first gate node connected to said reference voltage through a resistance, and a first source node connected to said bias current source node;

a second transistor having a second drain node connected to said Voutp node, a second gate node for a positive component of a differential reset signal, and a second source node; and a third transistor having a third drain node connected to said first gate node, a third gate node for a negative component of said reset signal, and a third source node connected to said second source node.

10. A differential reset architecture according to claim 9, further comprising a bias current source connected to said second source node and to said third source node.

11. A differential reset architecture according to claim 10, wherein said bias current source is a fourth transistor having a fourth drain node connected to said second source node and to said third source node, a fourth gate node connected to a bias voltage, and a fourth source node connected to a second reference voltage that is less than said reference voltage.

12. A differential reset architecture according to claim 9, wherein a logic high state of said differential reset signal drives said first transistor into a saturation state.

13. A differential reset architecture according to claim 12, wherein said logic high state of said differential reset signal drives said differential latch output to a logic low state.

14. A differential latch circuit comprising:

a first arrangement of transistors configured to perform a latch function, in response to a differential latch input and a differential dock signal, that provides a differential latch output, said first arrangement of transistors including a maximum of three levels of series-connected transistors; and a second arrangement of transistors connected to said first arrangement of transistors, said second arrangement of transistors being configured to perform a reset function, in response to a differential reset signal, that drives said differential latch output to a logic low state, said second arrangement of transistors including a maximum of three levels of series-connected transistors; wherein, said second arrangement of transistors comprises:

a first transistor having a first drain node connected to a reference voltage, a first gate node connected to said reference voltage through a resistance, and a first source node connected to a bias current source node of said first arrangement of transistors;

a second transistor having a second drain node connected to a positive output voltage node for a positive component of said differential latch output, a second gate node for a positive component of said differential reset signal, and a second source node; and a third transistor having a third drain node connected to said first gate node, a third gate node for a negative component of said differential reset signal, and a third source node connected to said second source node.

15. A differential latch circuit according to claim 14, wherein said first arrangement of transistors comprises:

a number of first-level transistors configured to process said differential latch input and said differential latch output;

a number of second-level transistors configured to process said differential clock signal; and at least one third-level transistor configured to provide a bias current.

16. A differential latch circuit according to claim 14, wherein said first arrangement of transistors comprises:

a first transistor having a first drain node connected to a negative output voltage (Voutn) node for a negative component of said differential latch output, a first gate node for a positive component of said differential latch input, and a first source node;

a second transistor having a second drain node connected to a positive output voltage (Voutp) node for a positive component of said differential latch output, a second gate node for a negative component of said differential latch input, and a second source node connected to said first source node;

a third transistor having a third drain node connected to said Voutp node, a third gate node connected to said Voutn node, and a third source node;

a fourth transistor having a fourth drain node connected to said Voutn node, a fourth gate node connected to said Voutp node, and a fourth source node connected to said fifth source node;

a fifth transistor having a fifth drain node connected to said first source node and to said second source node, a fifth gate node for a positive component of said differential clock signal, and a fifth source node; and a sixth transistor having a sixth drain node connected to said third source node and to said fourth source node, a sixth gate node for a negative component of said differential clock signal, and a sixth source node connected to said fifth source node.

* * * * *